United States Patent [19]

McNeil et al.

[11] Patent Number: 4,877,479
[45] Date of Patent: Oct. 31, 1989

[54] METHOD AND APPARATUS FOR ION DEPOSITION AND ETCHING

[75] Inventors: John R. McNeil; Scott R. Wilson, both of Albuquerque, N. Mex.

[73] Assignee: University of New Mexico, Albuquerque, N. Mex.

[21] Appl. No.: 212,272

[22] Filed: Jun. 27, 1988

Related U.S. Application Data

[63] Continuation-in-part of Ser. No. 28,246, Mar. 20, 1987, Pat. No. 4,758,304.

[51] Int. Cl.$^4$ .................. B44C 1/22; C03C 15/00; C23C 14/00; B05D 3/06
[52] U.S. Cl. .................. 156/626; 156/643; 156/654; 204/192.11; 204/192.13; 204/192.34; 427/8; 427/38
[58] Field of Search .............. 156/626, 627, 643, 646, 156/654, 345; 204/192.1, 192.11, 192.13, 192.32, 192.33, 192.34–298; 427/8–10, 38, 39, 140, 142; 118/728, 729, 50.1, 620; 364/525, 550, 560; 250/494.1; 356/357

[56] References Cited

U.S. PATENT DOCUMENTS

| | | |
|---|---|---|
| 3,548,189 | 12/1970 | Meinel et al. .................. 250/49.5 |
| 3,699,334 | 10/1972 | Cohen et al. .................. 250/49.5 |
| 4,367,044 | 1/1983 | Booth, Jr. et al. .................. 356/357 |
| 4,405,989 | 9/1983 | Tsukada et al. .................. 364/525 |
| 4,411,733 | 10/1983 | Macklin et al. .................. 156/643 |
| 4,450,031 | 5/1984 | Ono et al. .................. 156/345 |
| 4,457,803 | 7/1984 | Takigawa .................. 156/626 |
| 4,523,971 | 6/1985 | Cuomo et al. .................. 156/345 |

OTHER PUBLICATIONS

Sensitive Technique for Measuring Apparent Optical Figure Error Caused by Coating Nonuniformity, by H. E. Bennett and D. K. Burge; *Proc. Boulder Damage Symposium* 1981, *Laser Induced Damage in Optical Materials:* 1981, NBS Special Pub. 638, pp. 421–425.
Fundamentals of Ion-Source Operation by Harold R. Kaufman.
*Journal of Vacuum Science and Technology*, vol. 15, pp. 272–276 Mar./Apr. 1978, by H. F. Kaufman, et al.

Primary Examiner—William A. Powell
Attorney, Agent, or Firm—Robert W. Weig; Deborah A. Peacock

[57] ABSTRACT

The disclosure relates to maskless deposition and etching and more particularly to maskless deposition and etching of the surface of objects using single and multiple ion sources.

16 Claims, 6 Drawing Sheets

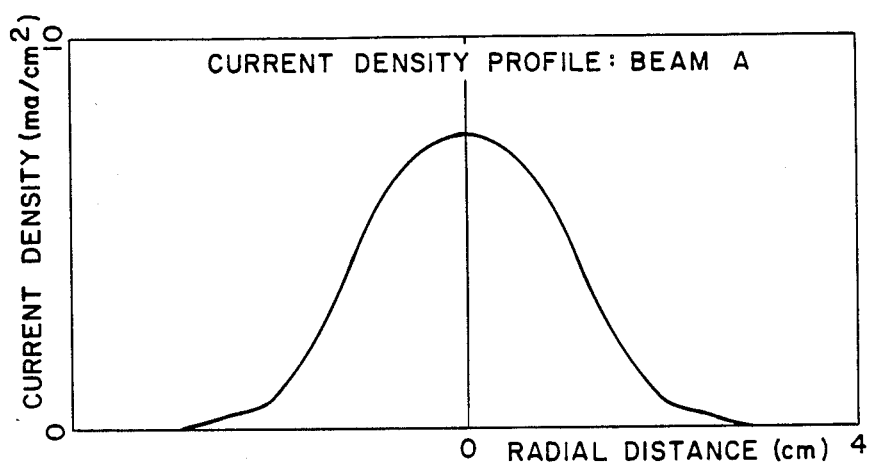
FIG—4A
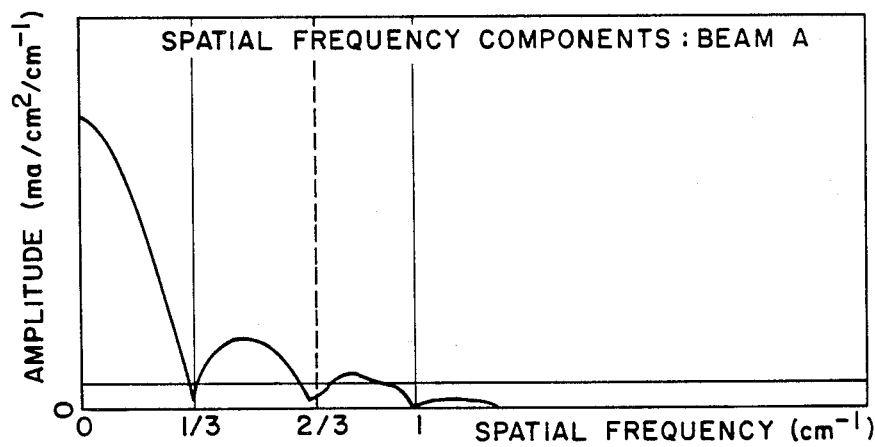
FIG—4B

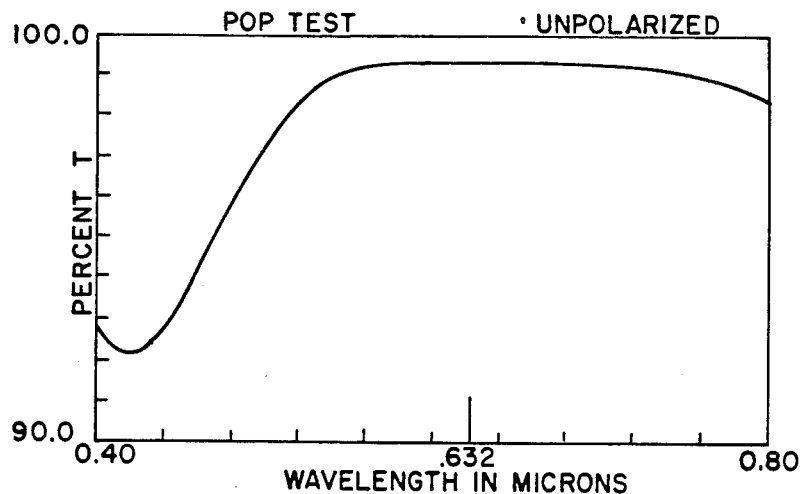
FIG—6A
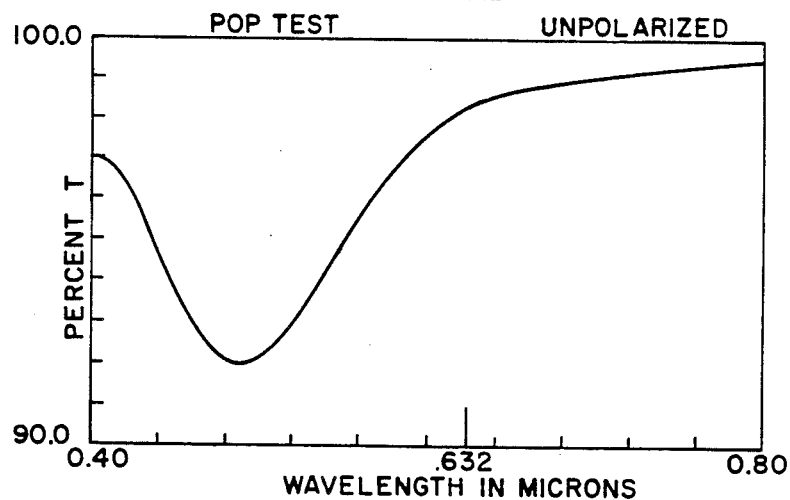
FIG—6B
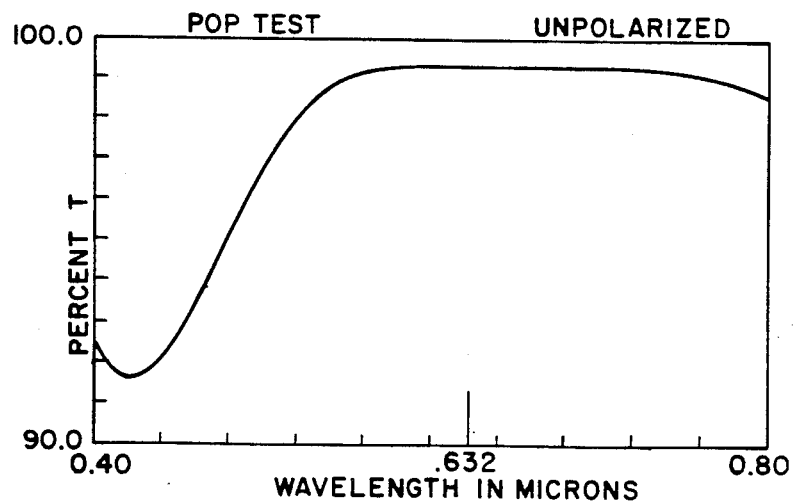
FIG—6C

METHOD AND APPARATUS FOR ION DEPOSITION AND ETCHING

This application is a continuation-in-part application of U.S. patent application Ser. No. 028,246, entitled "METHOD AND APPARATUS FOR ION ETCHING AND DEPOSITION," to McNeil, et al., filed on Mar. 20, 1987, U.S. Pat. No. 4758304, the teachings of which are incorporated herein by reference.

FIELD OF THE INVENTION

The invention relates to maskless ion deposition and etching and more particularly to maskless ion deposition and etching existing surface topographies of objects of predetermined topographies using single and multiple ion beam sources in accordance with an algorithm using image restoration.

BACKGROUND OF THE INVENTION

Precision optical, semiconductor, and microelectronic components, and the like, having physical coating and surface height aberrations smaller than one wavelength of the incident radiation, are of strategic importance to the operation of many optical systems. Such components are very expensive because of the enormous investment of time and sophisticated equipment required to fabricate and figure their optical coatings and surfaces. Conventional methods of fabricating and figuring optical surfaces involve grinding surfaces into optics using abrasives. Although modern optic grinders have better abrasives, tools and even equipment under computer control, the physical process is essentially the same as it has been for hundreds of years.

Ion etching, also known as ion sputtering and ion milling, has been tried as an alternative process to abrasion. Ion sputtering is a physical process in which an ion is caused to impinge upon a surface of an object with sufficient energy to cause atoms or molecules of the object to be liberated from its surface.

Sputtering has become a popular processing technique in the semiconductor industry. However, sputtering has not found use in modifying optical surfaces because efforts to use sputtering for optic surfacing were severely limited by the ion current from the ion sources available at the time. One type of ion source used in such attempts is known as a Cockraft-Walton accelerator. U.S. Pat. No. 3,548,189 to Meinel, et al., and No. 3,699,334 to Cohen, et al., illustrate such ion sources in their disclosed devices. The Cockraft-Walton as well as other ion accelerators used in such attempts are only capable of driving a maximum beam current of a few hundred microamperes and produce quite high ion energies, often a fraction of an MeV. Limitations result from the fundamental design of such ion sources. For example, such sources contain only a single aperture for ion extraction. The ion current extractable from a single aperture is proportional to the voltage applied to the aperture which in turn determines the ion energy. The use of a single aperture as in the prior art thus mandates that high voltage be applied to the ion extraction aperture which results in high energy ions in order to obtain an ion current on the order of a hundred microamperes. Due to such limitations ion beam etching has been essentially unworkable.

In the early 1970's the Kaufman ion source as disclosed in the publication, "Technology of Ion Beam Sources Used in Sputtering", *Journal of Vacuum Science and Technology*, Vol. 15, pp. 272-276, March/April 1978 by H. F. Kaufman, et al., was developed. The Kaufman ion source is capable of producing beam currents of a large fraction of an ampere, at energies within the 300-1500 eV range. The beam is sufficiently controllable, stable and repeatable, to be satisfactory for use in surface modification devices. A Kaufman ion source having a grid structure in accordance with the invention can produce minimum current levels of at least about 200 times and optimally about 800 to 1500 times the current level of the Cockraft-Walton and other devices used previously in ion etching. Such Kaufman ion source beam current is on the order of 30 to 400 mA versus a Cockraft-Walton device beam current of less than 0.3 mA. Additionally, the use of RF driven or ECR plasma ion sources employing dual-grid extraction (a key element in Kaufman ion sources) allows the use of all of the Kaufman ion sources benefits while obtaining greater simplicity, stability, and higher reliability in operation.

The ions used in the 3,548,189 device are of substantially the same energy and a uniform current density is necessary. Only narrow ion beam sources are used and, since there is no mechanism for the integrated use of deposition sources, selective deposition in combination with selective removal is not possible. Such devices are limited to the figuring of small diameter elements because beam deflection is used as the steering mechanism, the ion source not being translatable, i.e., movable. For large diameter optics, such as those having diameters on the order of one-half meter or more, the distance from the deflection plates to the surface would have to be typically greater than the diameter of the surface. Beam current losses due to residual gas in the chamber would be great and make the process very inefficient. Too, beam dwell pattern computation is not considered in such prior art devices and methods using image processing and systems theory for optimized material removal are not applied.

In devices such as that shown in U.S. Pat. No. 3,699,334, ion beam impingement control is limited to electrostatic and magnetic deflection of the beam and to rotation of the object to be etched. In practicing the invention, the ion source or sources themselves are moved. The ion sources used in the prior art are either constructed as an integral part of the vacuum system containing the object to be etched or they are external to the vacuum system and connected thereto by a tube which is evacuated with the vacuum system. No such prior art systems utilize translatable ion sources. Too, the ion beam is necessarily maintained continuously in such prior art devices in part because of the high voltages involved in extracting 20 kV to 100 kV ions. Dwell computations are based on a two-step method in which the symmetrical errors need first be reduced to zero. Then isolated symmetrical errors are removed. In practicing the invention all errors, symmetrical and non-symmetrical, are removed in one step. Arbitrarily shaped components are difficult to figure with such prior art devices. In addition, the beam energies of the prior art devices, 20 to 100 kV, are known to damage many materials. The apparatus of the invention operates at a maximum energy of about two kV. The prior art beam taught by the '334 patent only focuses the ion beam to a diameter between one and five millimeters whereas that of the invention focuses the ion beam within a two to five centimeter and larger range to enable the correction of a wide range of sizes of surface aberrations far more efficiently than with prior art devices. The ion source used in accordance with the invention provides electrons to avoid the electric charge effects requiring a separate source of electrons in prior art devices.

A further method for figuring surfaces is by the addition of material using selective deposition.

As seen in FIG. 1, a prior art selective deposition method required a fixed mask having, for example, large numbers of small holes with variable spacing and/or different sizes. The FIG. 1 mask can be used for non-symmetrical surfaces. Some prior art applications may even require a "dished out" mask so that the mask strays within a short distance of the surface at all points.

The prior art rotating mask of FIG. 2 is suited primarily to rotationally symmetric surfaces although tilting the surface with respect to the mask can generate some aspherics. The surface produced by using this mask often shows a small spike immediately under the center of the mask. Additionally, this mask must take into account the spreading of the evaporant beam from the plane of the mask to the plane of the optic surface.

Using the prior art masks of FIGS. 1 and 2, one places what amounts to a stencil in front of the presumably uniform, (often approximated by planetary rotation) deposition source, in much the same way as one spray-paints a stencil onto a surface. The various mathematical techniques used to determine the mask shape must take into account the spreading of the evaporant stream on its way to the surface.

Major problems with the masked selective deposition methods of the prior art are that the mask material may become a contaminant in the deposited film and the mask may be difficult to fabricate. The rotating mask additionally produces a surface spike at the center of the masked area and has very critical alignment requirements.

In practicing the invention, selective surface deposition is performed using single or plural deposition sources which can be characterized for deposition profile. The profile can be used in accordance with a material deposition algorithm to deposit any surface, asymmetric aspheric included, without using a physical mask. This reduces film contamination, simplifies the equipment, increases reliability, and decreases the amount of time required to figure a surface by selective deposition.

Although very small features, much less than the diameter of the beam, cannot be deposited without a mask, surfaces much larger than the diameter of the beam can be easily deposited in accordance with the invention.

Even in those cases where a mask must be used, the ability to raster the deposition source across the mask in accordance with the invention provides the capability to produce very uniform exposures which is especially important when working on large surfaces.

Thus, it can be seen that the prior art devices and methods cannot figure large surfaces and cannot use both removal and deposition to figure a surface. Such devices are limited to low current, high energy, narrow beam ion sources and the control of beam current spatial distribution is difficult. Large and non-symmetric surfaces cannot be etched or deposited upon by such devices and methods.

SUMMARY OF THE INVENTION

In accordance with the invention, there is provided a method using maskless deposition for changing the existing topography of the surface of an object to a predetermined topography. The method comprises the steps of comparing the existing topography of the surface to the predetermined topography, and using an algorithm comprising large restoration, using maskless deposition, including ion assisted deposition, selectively adding material to the surface of the object to cause the surface to reach the predetermined topography. The predetermined topography may be symmetric or non-symmetric. A plurality of deposition sources, such as sputter, evaporation, laser, IBS, and other sources with or without an ion assist, can be used. The invention also comprises a method using ion etching for changing the existing topography of the surface of an object to a predetermined topography. The method comprises the steps of comparing the existing topography of the surface to the predetermined topography, and using an algorithm comprising image restoration, and using a plurality of ion sources, selectively etching material from the surface of the object to cause the surface to reach the predetermined topography. The invention additionally comprises a method for tuning the thickness of a coating on an optical object to provide the object with substantially consistent light transmission or reflectivity over a relatively broad optical spectrum. The method comprises the steps of providing an object having a coating to be tuned, and using an algorithm comprising image restoration, etching the surface of the coating with an ion beam to selectively remove material therefrom, thereby causing the coating to reach the predetermined thickness. A single or a plurality of ion sources can be used. Deposition, including ion-assisted deposition, as well as ion etching can be used to tune the coating thickness. The coating is preferably tunable to a thickness of less than about 25 Angstroms and most preferably to a thickness of less than about 12 Angstroms.

One object of the present invention is, using one or more ion sources, to selectively etch the surfaces and coatings of objects.

Another object of the invention is to selectively use deposition to figure the surface of an object.

Yet another object of the present invention is to use selective deposition to figure the surface of an object to a thickness accuracy of within 25 Angstroms.

Still another object of the invention is to produce predetermined symmetric and non-symmetric surfaces.

Another object of the invention is to use both etching and deposition to produce surfaces having predetermined topographies.

One advantage of the present invention is that in accordance therewith, both transmissive and reflective objects can be economically produced.

Another advantage of the present invention is that in accordance therewith, a high current, low energy, broad ion beam can be used to etch a desired surface configuration on an object.

Yet another advantage of the invention is that surface extrapolations can be used to avoid edge effects.

Still another advantage is that high surface curvature and complex surfaces can be figured.

Yet another advantage of the invention is that an object may have its surface figured, then evaluated for acceptability, and have subsequent operations such as thin film coating performed thereon without the object being removed from a vacuum system.

Still another advantage is that delicate and lightweight objects can be figured because there is no weight loading on the object in practicing the invention as in conventional grinding or milling methods.

Other objects, advantages and novel features, and further scope of applicability of the present invention will be set forth in part in the detailed description to follow, taken in conjunction with the accompanying drawing, and in part will become apparent to those skilled in the art upon examination of the following, or may be learned by practice of the invention. The objects and advantages of the invention may be realized and attained by means of the instrumentalities and combinations particularly pointed out in the appended claims.

BRIEF DESCRIPTION OF THE DRAWINGS

The accompanying drawings, which are incorporated into and form a part of the specification, illustrate several embodiments of the present invention and, together with the description, serve to explain the principles of the invention. In the drawings:

FIGS. 4A-D show beam profiles and spatial frequency components for two ion beams.

FIGS. 6A-C graphically show coating transmission consistency across a relatively broad optical spectrum for different coating thicknesses in the FIG. 5 object.

DETAILED DESCRIPTION OF THE INVENTION

Figure 1:
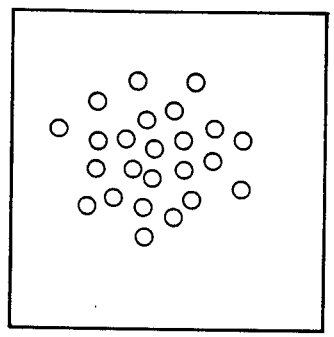
FIG. 1 shows a prior art stationary deposition mask.
Figure 2:
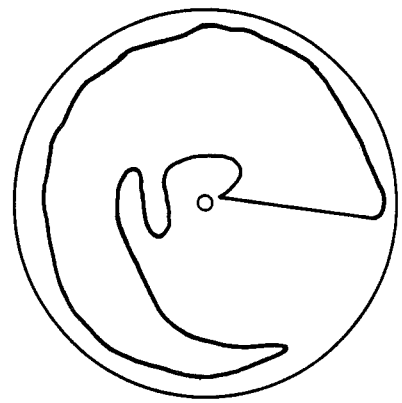
FIG. 2 shows a prior art rotating deposition mask.
Figure 3:
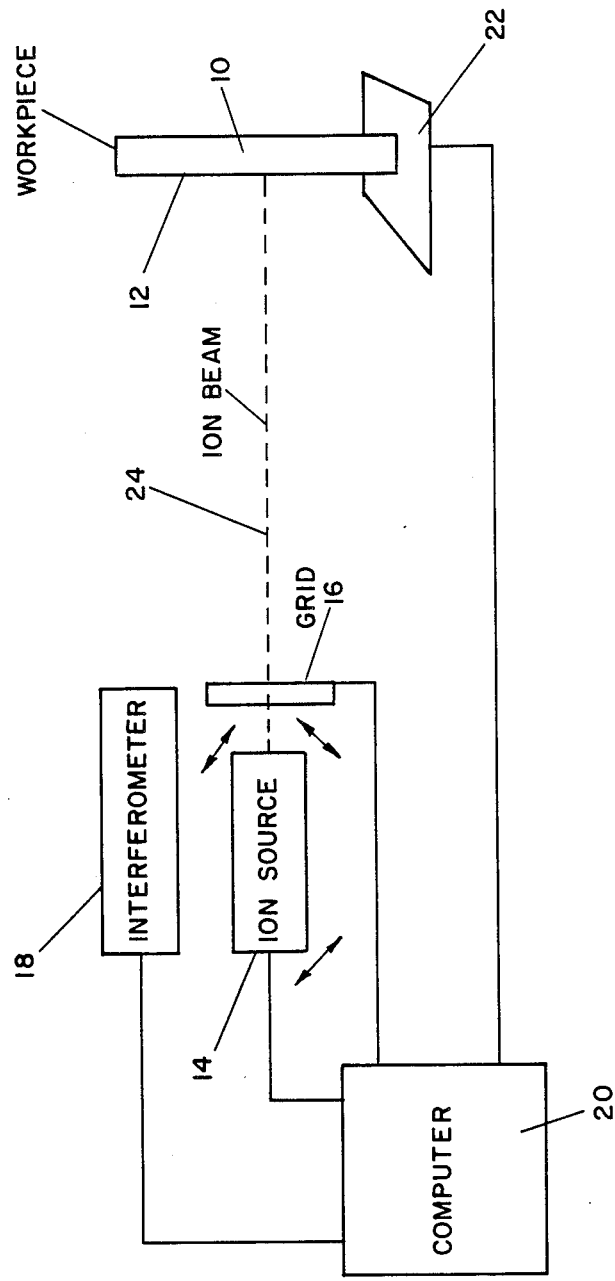
FIG. 3 illustrates a system for performing the method of the invention.
Figure 4C:
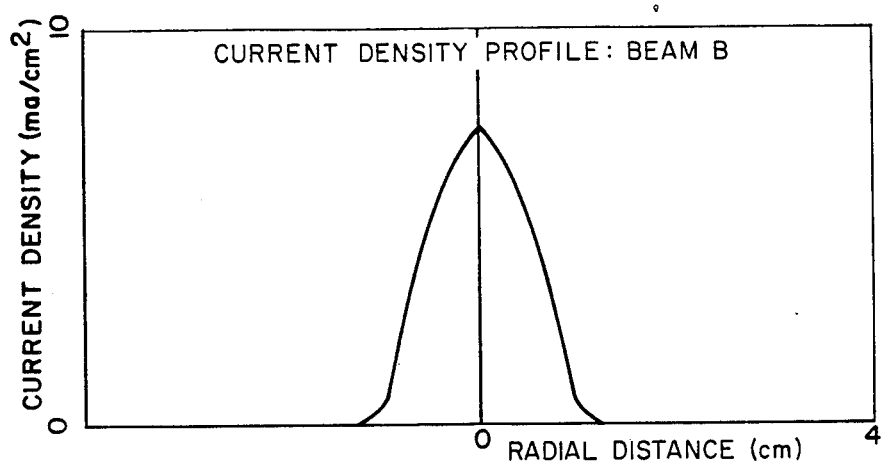
Figure 4D:
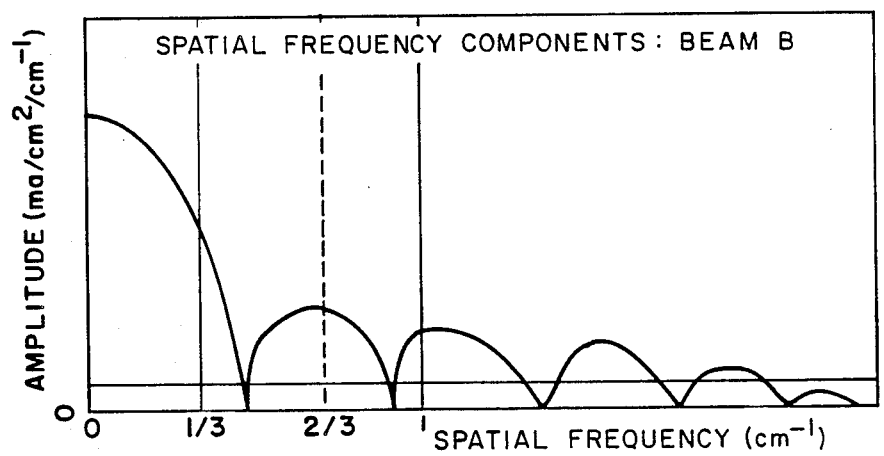

Reference is now made to FIG. 3, which illustrates a system suitable for carrying out the method of the invention. As seen therein, an object 10 having a surface 12, beam source 14, an ion source grid 16, and an interferometer or other surface determining or monitoring instrument 18 such as a phase measuring interferometer or heterodyne interferometer are positioned within a vacuum chamber (not shown). A computer 20 is operatively connected to an apparatus 22 for controlling the position of object 10. Beam source 14 and ion source grid 16 are also under the control of computer 20 as is monitoring instrument 18. Ion source 14 is preferably a Kaufman ion source such as disclosed in a publication, *Fundamentals of Ion-Source Operation* by Harold R. Kaufman, Library of Congress Catalog Card Number 84-71750, although other sources may be used, including electron cyclotron resonance (ECR) and microwave plasma ion sources. Kaufman sources are well known and produce high current, low energy broad ion beams containing nearly monoenergetic ions so that ion beam sputtering therewith is essentially a linear process. The removal profile of the beam from source 14 is essentially the same regardless of where on the surface 12 of object 10 beam 24 is directed. Thus, sputtering yield remains constant. Beam source 14 and/or object 10 is translatable so that in operation the beam 24 remains normal, or at another selected angle, to surface 12 or to a reference plane or surface. The beam profile 24 does not change appreciably and its current energy distribution remains substantially constant during operation. Beam source 14 may additionally comprise a sputter magnetron or other device for ion assisted or other deposition.

In accordance with the invention, an algorithm compares a desired predetermined surface topography with the existing surface topography of surface 12 on object 10 and utilizing image restoration, controls beam 24 to provide deposition, such as ion assisted deposition, upon or to ion etch surface 12 to produce the predetermined surface topography. The predetermined topography may be symmetric or non-symmetric and ion assisted deposition may be also used to figure surface. The surface to be etched can be that of a coating.

By using several ion beam removal profiles, it is possible to cover the entire spatial frequency range as shown in FIGS. 4A-4D. Here, the nulls in the spatial frequency components of the broad beam can be chosen to fall on non-null components of a narrower beam. The use of both beams then covers the whole spatial frequency range of interest. The broad beams usually run higher current than the narrower beams. Higher beam current translates directly to faster material removal. The tradeoff is then to use the broadest available profiles as much as possible before using the narrower beams, provided that the spatial frequency range of the object figure error is properly covered.

The different beam profiles can be obtained by using different ion sources, varying the grid operation, masking fixed beam profiles, or altering the operating environment. If multiple ion sources are used, all sources can be operating simultaneously on different parts of the optic. This reduces the elapsed time for figuring while still obtaining the correct figure. The order of application of the different removal profiles is not significant because the material removal is linear and invariant with respect to space, ion dose, and time.

In many cases, the ion beam dwell time array exhibits regions in which little time is spent by the ion source, while other regions have a much larger time spent on them. The use of a single fixed array of ion sources achieves some speed-up in elapsed time, particularly if each source is on for about the same amount of time as the whole array moves across the optic (for uniform removal or deposition). The entire array should remain fixed for the dwell time specified by the largest element in the dwell time array corresponding to the position of each source in the array. In this case, it is better to have several completely separate arrays of sources, some of which dwell on the regions requiring the most material removal (a smaller total area), with the other arrays working on larger total areas where smaller dwell times are required. Practicing the invention thereby makes optimum use of the available ion current to get the shortest elapsed figuring time.

In practicing the invention, ion etching and ion depositing beam figuring is controlled using deconvolution for nearly flat optics, and matrix computations for optical and other elements having large surface slopes and high curvatures. The model for figuring computation begins with the superposition integral, $$f(x,y) - d(x,y) = \int_{-\infty}^{\infty} \int_{-\infty}^{\infty} t(\alpha,\beta) h(x,\alpha,y,\beta) d\alpha d\beta \quad (1)$$

where $h(x,\alpha,y,\beta)$ is the impulse response or point-spread function for the system model. In this case, the impulse is located at point $(\alpha,\beta)$. The function $f(x,y)$ is the original surface profile or existing topography of the optic or other element, and the function d(x,y) is the desired surface profile or predetermined surface topography. The function t(α,β) is the time that the ion beam dwells on the element at point (α,β). The function h(x,α,y,β) is the material removal profile for the ion beam.

The material removal profile described as h(x,α,y,β) is spatially variant. The shape of the removal profile can change depending on where the ion beam is pointed. If the removal profile is found not to change with position, then the removal profile is said to be position invariant or spatially invariant. The removal function may also have additional parameters related to dynamically changing the mechanical and electromagnetic configuration of the ion source.

For surfaces containing no large slop changes, the removal or deposition profile is spatially invariant for the ion sources used in practicing the invention. Surfaces having significant curvature will induce spatially variant removal or deposition profiles.

Figuring can also be performed by depositing material using a single deposition source or a plurality of deposition sources. In this case, the removal function is replaced with an addition function which satisfies the same constraints as the removal function. Those skilled in the art will understand that the calculations of the control parameters using additive techniques, e.g., ion deposition, are the same as the calculations of the control parameters for material removal, e.g., ion etching.

All of the functions but t(α,β) are known or measurable. To perform surface figuring, the function t(α,β) must be calculated. Because surface figuring in accordance with the preferred embodiment of the invention is under digital control, metrology and instrumentation, the integrals of equation 1 are replaced with summations and the domain is discrete. For the spatially invariant case, the superposition summation reduces to the definition of the discrete convolution.

$$f(x,y) - d(x,y) = \sum_\alpha \sum_\beta t(\alpha,\beta) h(x - \alpha, y - \beta). \tag{2}$$

Equation 2 can be solved using matrix techniques. However, using orthogonal transforms is easier and provides insight into the success or failure of the figuring operation.

An orthogonal transform such as the Fourier, Hadamard, Hartley, Cosine, and the like, has the property of diagonalizing a circulant (one dimensional) or block-circulant (two dimensional) matrix. This means that the solution to equation 2 in terms of t(α,β) can be obtained using algebraic techniques, provided that the removal or addition profile is spatially invariant. This procedure is described hereinbelow.

Let $\mathcal{F}$ be an orthogonal transform. Taking the transform of both sides of equation 2 gives $$F(u,v) - D(u,v) = T(u,v)H(u,v). \tag{3}$$

where F is the transform of f(x,y)(F(u,v)=$\mathcal{F}${f(x,y)}), D is the transform of D(x,y), the coordinates (u,v) are the conjugate coordinates to the spatial coordinates (x,y), etc. Equation 3 can be rearranged to form $$T(u,v) = \frac{F(u,v) - D(u,v)}{\gamma H(u,v)} \tag{4}$$

where γ is a multi-variate function used to control the division when H(u,v) approaches zero or when F-D becomes noisy. When γ=1, equation 4 is called an inverse filter. When γ is a function of the signal-to-noise ratio at the transform coordinate (u,v), equation 4 is a Least Squares or Wiener filter. The function γ can be optimized to produce a time dwell array t(x,y)=$\mathcal{F}^{-1}${F(u,v)} which has optimal or special properties when applied as the time dwell array for an ion beam figuring operation.

Filters constructed using equation 4 are called restoration, deblurring or deconvolution filters and are used extensively in image processing and system controls.

Once all of the functions in equation 2 are known, the residuals arising from the ion figuring process can be calculated by forming $$E(u,v) = F(u,v) - D(u,v) - T(u,v)H(u,v) \tag{5}$$

for different conditions applied with γ. E(u,v) is the error between the desired surface and what can actually be achieved with a well characterized ion figuring process. In accordance with the invention, by looking at e(x,y)=$\mathcal{F}^{-1}${E(u,v)}, one can evaluate the prospects for a successful figuring operation before any work is actually done. This step provides for the rejection of those optical or other elements which have surfaces that are economically or otherwise unsuitable for ion beam figuring by removal or deposition.

For the case where the ion beam removal or deposition function is spatially variant, the time dwell array, calculated using matrix methods, is represented by $$r = Ht \tag{6}$$

where r is a vector formed by stacking the rows of f(x,y)−d(x,y), t is formed by stacking the rows of t(x,y), and H is formed by stacking partitions formed by stacking the rows of the point-spread function h(x,α,y,β) for each (α,β). The matrix H is the spatially varying point-spread function (PSF) matrix. The time array is recovered by forming $$t = H^{-1}r \tag{7}$$

where $H^{-1}$ is the inverse of the matrix H. When the point-spread function is spatially invariant, H can be diagonalized by an orthogonal transform as described previously.

The matrix H is somewhat ill-conditioned, meaning that small amounts of noise or error present in the matrix coefficients will have a large effect on the coefficients in the inverse matrix. To help alleviate this problem, the inverse matrix can be calculated using Singular Value Decomposition (SVD) or Q-R or other decompositions where unstable vectors are removed from the inverse calculation. This produces an approximation to the solution, but one that has higher tolerance to noise. Iterative constrained conjugate gradient optimization can also be used to perform the calculation for the inverse PSF matrix.

The use of the constraints or vector removal corresponds to the use of γ≠1 in equation 4. An estimate of the residuals after figuring with a well characterized ion beam figuring process can be found by forming $$e = r - H^{-1}t \tag{8}$$

where $H^{-1}$ is the calculated inverse point-spread matrix. The error vector can then be unstacked to form an error image which can be inspected for figurability just as in the spatially invariant case.

Edge effects are produced with conventional figuring techniques due to the inherent properties of polishing tools. For efficient material removal, a tool should be fairly stiff. As the tool moves so that part of it extends beyond the edge of the element being figured, pressure increases on the part of the surface in contact with the tool and the removal profile distorts. Surface material within the radius of the tool is improperly figured, thereby causing an edge effect. Although many attempts have been made to solve this problem in conventional grinding or milling, the effect remains. Similar problems exist in all types of surface contact tools and devices for material removal.

In ion beam figuring, removal and deposition profiles do not depend on mechanical supports and the ion beam profile remains the same whether or not an object to be figured is in place. Thus, optics and other elements having essentially no edge effects can be produced. Because the beam dwell array value at a given point depends on the condition of the surface in a region around that point, the size of the region being about the same size as the spatial extent of the removal or addition function, the dwell array value depends in part on a condition which does not exist, since it is off the edge of the object. In practicing the invention, the image of the object provided by the metrology is treated as a small piece of an infinite surface. Using this model, the measured surface map of the object is imagined to be an apertured rendition of the surface map of a much larger object extending far beyond the field of view of the metrological instrumentation. Data is constructed to fill in those parts of the surface map which would correspond to those parts of the larger object obscured by the aperture. Hence the image restoration or matrix solutions see a modified object with no abrupt edge and compute the correct dwell array for the original object. The constructed data must have the same properties in terms of surface structure as the original object because there should be a match of the real data with the nonphysical data at the edge of the physical object.

Construction of data beyond the edge of the physical object is achieved with Band Limited Surface Extrapolation (BLSE) using orthogonal transforms. Original data is filtered to provide a smoothed result with some data outside the original data. The original data is then re-inserted into the resultant image. These steps are repeated a number of iterations to build up data outside the original data area, limited in frequency content by the filter which provides the band limits.

The building up of the off-edge data can be very slow. The rate of construction of data is partially determined by the band limit filter. Since ideal filters introduce "ringing" artifacts into the image, variable order filters, such as Butterworth, Chebyshev, or other more advanced filters, can be used to improve the rate of convergence to an acceptable quality. In practicing the invention, the cutoff frequency of the filter is varied during the progressive iterations, typically proceeding from higher bandwidths to lower bandwidths, with the final iterations being performed using the transform of the ion beam removal or deposition function as the filter. The ion beam removal or deposition function is the optimal filter because it eliminates any frequencies not present in the ion beam itself, alleviating restoration difficulties in equation 4.

To further speed the convergence, the filters are set during early iterations to amplify, in some cases nonlinearly, some of the frequencies in the pass band. This builds up the nonphysical data areas more quickly than when conventional normalized filters are used.

Additional gains in edge smoothness are obtained in some cases by offsetting the object surface with respect to its reference plane. This costs additional figuring time during which the centroid of the ion beam is mostly off of the surface of the object being figured. However, this produces higher quality edge figure.

The invention is applicable to the production of large optical or other surfaces due to its inherent scalability. As the size of a work piece is increased, ion beam current can be increased by using larger ion sources or by using a plurality of smaller ion sources which can be run simultaneously. The use of a plurality of sources reduces the time needed to figure a particular surface and distributes the thermal load across the surface of the element during fighting to thereby reduce thermally induced distortion. The plurality of sources may all be of the same size or more likely, of different selected sizes to minimize object figuring time. The use of several size ion sources also provides figuring over large spatial frequency bands which results in a better final surface figure as previously discussed with reference to FIGS. 4A-4D. Spatial ion beam current density can be dynamically tuned using single or plural sources in practicing the invention to provide an optimal final surface figure.

Because weight loading due to gravity and forces applied in conventional figuring techniques and mechanical distortion caused by polishing tool weight are eliminated, very light weight and flexible optical and other elements can be figured using the invention.

Figure 5:
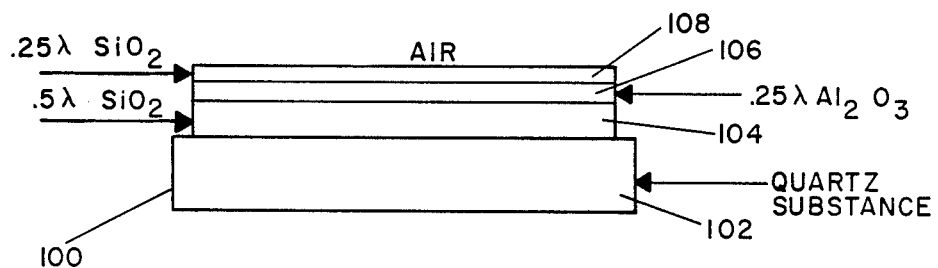
FIG. 5 illustrates a coating on an object to be ion beam etched in accordance with the invention.

As an example of the tuning of a coating, the following situation can be considered. The FIG. 5 structure 100 comprises a base object 102, a coating 104 of $0.5\lambda$ $SiO_2$, a coating 106 of $0.25\lambda$ $Al_2O_3$, and a top coating 108 of $0.25\lambda$ $SiO_2$, where $\lambda$ is the wavelength of light. The coatings 104, 106 and 108 comprise an anti-reflecting coating for the visible wavelengths. This design is for 632 nm (HeNe laser red). If the individual film layers are too thick by 1/20th of a wavelength ($\lambda$), the transmission spectrum is distorted significantly from that desired.

In accordance with the invention, etching can be accomplished using the algorithm to correct the layer thicknesses. For example, if the layers are corrected to ±1/100th of a wavelength, the transmission spectrum is very much improved. Other techniques, including interferometry, can be used to monitor the layer thickness. For example, "Sensitive Techniques for Measuring Apparent Optical Figure Error Caused by Coating Nonuniformity" (H. E. Bennett and D. K. Burge, *Proc. Boulder Damage Symposium* 1981, *Laser Induced Damage in Optical Materials:* 1981, NBS Special Pub. 638, pp. 421) shows that monitoring the optical phase by ellipsometry is a very sensitive technique.

The transmission spectra for the ideal, incorrect, and algorithm corrected film stacks were computed using a thin films design and analysis program. The transmission spectrum for the ideal case (perfect layer thickness) is shown in FIG. 6A, the spectrum corresponding to the case where the layers are too thick is shown in FIG. 6B and the corrected stack (layers individually monitored and corrected) has the transmission spectrum shown in FIG. 6C.

Tables A, B, and C show the layer thicknesses for the FIGS. 6A, 6B, and 6C examples.

The thickness of the layers are preferably monitored after deposition by spectrophotometric techniques, although in some cases, interferometry may be adequate. If spectrophotometry is used, the measurement is spatially resolved to obtain the thickness at all points on the surface, as prescribed by the IBF control algorithm.

TABLE A

| Layer | Material | Index | Waves | Microns thk |
|---|---|---|---|---|
| 104 | SiO$_2$ | 1.4500 | 0.50000 | 0.21793 |
| 106 | Al$_2$O$_3$ | 1.6500 | 0.25000 | 0.09576 |
| 108 | SiO$_2$ | 1.4500 | 0.25000 | 0.10897 |

| Light Polarization | Reflectance % | Transmission % |
|---|---|---|
| s-pol | 0.7476 | 99.2523 |
| p-pol | 0.7476 | 99.2523 |
| both | 0.7476 | 99.2523 |

TABLE B

| Layer | Material | Index | Waves | Microns thk |
|---|---|---|---|---|
| 104 | SiO$_2$ | 1.4500 | 0.55000 | 0.23972 |
| 106 | Al$_2$O$_3$ | 1.6500 | 0.30000 | 0.11491 |
| 108 | SiO$_2$ | 1.4500 | 0.30000 | 0.13076 |

| Light Polarization | Reflectance % | Transmission % |
|---|---|---|
| s-pol | 1.5927 | 98.4072 |
| p-pol | 1.5927 | 98.4072 |
| both | 1.5927 | 98.4072 |

TABLE C

| Layer | Material | Index | Waves | Microns thk |
|---|---|---|---|---|
| 104 | SiO$_2$ | 1.4500 | 0.51000 | 0.22229 |
| 106 | Al$_2$O$_3$ | 1.6500 | 0.24000 | 0.09193 |
| 108 | SiO$_2$ | 1.4500 | 0.26000 | 0.11332 |

| Light Polarization | Reflectance % | Transmission % |
|---|---|---|
| s-pol | 0.7542 | 99.2458 |
| p-pol | 0.7542 | 99.2458 |
| both | 0.7542 | 99.2458 |

Various grid structures, such as those described in U.S. patent application Ser. No. 028,246, of which this is a continuation-in-part, can be used to practice the method of the invention, which is particularly suitable for figuring the surfaces of large optics and other elements.

In practicing the invention, after a surface is figured, it may be coated with an additional material. Thus, the invention can be used to manufacture a mirror by etching or depositing material to figure a surface and then coating the surface by ion assisted or other deposition with a reflective coating. Similarly, a nonreflective or other coatings may be added to an object figured in accordance with the invention. The method of the invention is particularly useful to coat objects which are damaged when heated, since many conventional coating techniques require the substrate be heated to between 150° and 300° C. Ion assisted deposition of coatings may be carried out using a magnetron or other such device.

Although the invention has been described with reference to these preferred embodiments, other embodiments can achieve the same results. Variations and modifications of the present invention will be obvious to those skilled in the art and it is intended to cover in the appended claims all such modifications and equivalents.

We claim:

1. A method using maskless deposition for changing the existing topography of the surface of an object to a predetermined topography, the method comprising the steps of:
   (a) comparing the existing topography of the surface to the predetermined topography,
   (b) using an algorithm comprising image restoration, using maskless deposition, selectively adding material to the surface of the object to cause the surface to reach the predetermined topography.

2. The invention of claim 1 wherein the maskless deposition comprises ion assisted deposition.

3. The invention of claim 1 wherein the predetermined topography is symmetric.

4. The invention of claim 1 wherein the predetermined topography is non-symmetric.

5. The invention of claim 1 wherein said algorithm is:

$$t(x,y) = \mathcal{F}^{-1}\left[ \frac{F(u,v) - D(u,v)}{\gamma H(u,v)} \right]$$

where at t(x,y) a deposition beam is at each point (x,y),

F(u,v) is the orthogonal transform of a predetermined surface,

D(u,v) is the orthogonal transform of the desired surface profile,

H(u,v) is the orthogonal transform of the surface material modification profile, $\mathcal{F}^{-1}$ is the inverse orthogonal transform of the forward transform used to form F, D and H, and γ is the multivariate parameter.

6. The invention of claim 1 wherein the beam emerges from a grid comprising a plurality of discrete sources spaced in a predetermined pattern.

7. The invention of claim 6 further comprising controlling the spatial distribution of the ion beam.

8. The invention of claim 1 wherein step (b) uses a plurality of deposition sources.

9. A method using ion etching for changing the existing topography of the surface of an object to a predetermined topography, the method comprising the steps of:
   (a) comparing the existing topography of the surface to the predetermined topography,
   (b) using an algorithm comprising image restoration, and using a plurality of ion sources, selectively etching material from the surface of the object to cause the surface to reach the predetermined topography.

10. A method for tuning the thickness of a coating on an object to provide the object with selected characteristics, the method comprising the steps of:
    (a) providing an object having a coating to be tuned,
    (b) using an algorithm comprising image restoration, etching and depositing on the surface of the coating with an ion beam and deposition sources to selectively remove and add material, thereby causing the coating to reach the predetermined thickness.

11. The invention of claim 10 wherein step (b) comprises using a single ion source.

12. The invention of claim 10 wherein step (b) comprises using a plurality of ion sources.

13. The invention of claim 10 wherein the coating is tuned to a thickness variation of less than about 25 Angstroms.

14. The invention of claim 10 wherein the coating is tuned to a thickness variation of less than about 12 Angstroms.

15. The invention of claim 10 wherein one selected characteristic is transmissivity.

16. The invention of claim 10 wherein one selected characteristic is reflectivity.

* * * * *